(12) United States Patent
Song et al.

(10) Patent No.: US 9,029,846 B2
(45) Date of Patent: May 12, 2015

(54) DISPLAY APPARATUS HAVING IMPROVED BENDING PROPERTIES AND METHOD OF MANUFACTURING SAME

(71) Applicant: Samsung Display Co., Ltd., Yongin, Gyeonggi-Do (KR)

(72) Inventors: Seung-Yong Song, Yongin (KR); Seung-Hun Kim, Yongin (KR); Cheol Jang, Yongin (KR)

(73) Assignee: Samsung Display Co., Ltd. (KR)

( * ) Notice: Subject to any disclaimer, the term of this patent is extended or adjusted under 35 U.S.C. 154(b) by 53 days.

(21) Appl. No.: 14/032,620

(22) Filed: Sep. 20, 2013

(65) Prior Publication Data

US 2014/0367644 A1 Dec. 18, 2014

(30) Foreign Application Priority Data

Jun. 13, 2013 (KR) .................. 10-2013-0067942

(51) Int. Cl.
*H01L 27/32* (2006.01)
*H01L 51/00* (2006.01)
*H01L 51/56* (2006.01)

(52) U.S. Cl.
CPC ........ *H01L 51/0097* (2013.01); *H01L 27/3244* (2013.01); *H01L 51/56* (2013.01); *H01L 2251/56* (2013.01); *H01L 2251/5338* (2013.01)

(58) Field of Classification Search
CPC .................. H01L 27/156; H01L 32/3297
USPC ................... 257/40; 438/26, 34, 99
See application file for complete search history.

(56) References Cited

U.S. PATENT DOCUMENTS

| 8,237,165 B2 | 8/2012 | Kim et al. | |
| 2006/0028128 A1* | 2/2006 | Ohkubo | 313/506 |
| 2011/0195240 A1 | 8/2011 | Inenaga | |
| 2012/0170244 A1 | 7/2012 | Kwon et al. | |

FOREIGN PATENT DOCUMENTS

| KR | 10-2010-0130898 | 12/2010 |
| KR | 10-2011-0079711 | 7/2011 |
| KR | 1020110106539 A | 9/2011 |
| KR | 10-2012-0079672 | 7/2012 |

* cited by examiner

*Primary Examiner* — Daniel Shook
(74) *Attorney, Agent, or Firm* — Innovation Counsel LLP

(57) ABSTRACT

Disclosed is a display apparatus. The display apparatus includes: a display module including a flexible substrate, a display panel, and an encapsulation film; a lower module disposed below the display module; an upper module disposed on the display module; and an elasticity-adjusting layer disposed on or below the display module to adjust a position of a neutral plane in bending of the display apparatus, wherein an elastic modulus of the elasticity-adjusting layer is less than that of at least one of the display module, the lower module, or the upper module, so as to position the neutral plane within or proximate to the display module.

20 Claims, 7 Drawing Sheets

DISPLAY APPARATUS HAVING IMPROVED BENDING PROPERTIES AND METHOD OF MANUFACTURING SAME

CROSS-REFERENCE TO RELATED PATENT APPLICATION

This application claims priority to, and the benefit of, Korean Patent Application No. 10-2013-0067942, filed on Jun. 13, 2013 in the Korean Intellectual Property Office, the disclosure of which is incorporated herein by reference in its entirety.

BACKGROUND

1. Field

Embodiments of the present invention relate generally to a display apparatus and a method of manufacturing the same, and more particularly to a display apparatus having improved bending properties as well as a method of manufacturing the same.

2. Description of the Related Art

Along with recent rapid advances in semiconductor technology, the performance of display apparatuses has improved to increase the screen size of flat display apparatuses, decrease the weight thereof, and the like, thereby causing a tremendous increase in demand for such flat display apparatuses.

Examples of such flat displays include liquid crystal displays (LCDs), plasma display devices (PDPs), field emission display devices (FEDs), electroluminescence display devices (ELDs), electrophoresis display devices (EPDs), organic light-emitting diode (OLED) display devices, or the like.

There is a large appeal for flexible flat display apparatuses capable of continuously maintaining display performance even when they are bent. Such flexible displays employ a substrate formed of flexible materials.

However, when even a flexible display apparatus is excessively bent or is bent too many times, various components such as their thin film transistors, conductive wirings, or the like may be damaged, leading to decreased performance.

SUMMARY

Embodiments of the present invention provide a display apparatus capable of minimizing strain at a part vulnerable to bending by adding an elasticity-adjusting layer, so that the display apparatus has improved durability against bending.

According to an aspect of the present invention, there is provided a display apparatus including: a display module including a flexible substrate, a display panel, and an encapsulation film; a lower module disposed below the display module; an upper module disposed on the display module; and an elasticity-adjusting layer disposed on or below the display module to adjust a position of a neutral plane in bending of the display apparatus. An elastic modulus of the elasticity-adjusting layer is less than that of at least one of the display module, the lower module, and the upper module, so as to position the neutral plane within or proximate to the display module.

The elasticity-adjusting layer may comprise at least two types of materials having different elastic moduli.

The elasticity-adjusting layer may comprise a stack of at least two types of materials having different elastic moduli.

The elasticity-adjusting layer may include at least one of a silicone-group resin and an acryl-group resin.

The elastic modulus of the elasticity-adjusting layer may be about six orders of magnitude less than that of the display module.

The elastic modulus of the elasticity-adjusting layer may have a value within a range of about $1 \times 10^{-7}$ to about $0.6 \times 10^{-6}$ times that of the display module.

The elasticity-adjusting layer may include an adhesive material.

The thickness of the elasticity-adjusting layer may have a value within a range of about one to about three times that of the display module.

The upper module may include a touch panel, an adhesive layer, and a window.

The upper module may have a thickness that is greater than that of the lower module.

According to another aspect of the present invention, there is provided a display apparatus including: a display module including a flexible substrate, a display device, an encapsulation film, and a polarizing plate; a lower module disposed below the display module; a first elasticity-adjusting layer disposed between the lower module and the display module; an upper module disposed on the display module; and a second elasticity-adjusting layer disposed between the upper module and the display module. The first elasticity-adjusting layer and the second elasticity-adjusting layer may each have an elastic modulus that is less than that of at least one of the display module, the lower module, and the upper module, so as to position a neutral plane in bending of the display apparatus to be within or proximate to the display module.

The upper module may include a touch panel, an adhesive layer, and a window.

The upper module may have a thickness that is greater than that of the lower module.

The display module may include an organic light-emitting device (OLED) and a thin film transistor.

According to another aspect of the present invention, there is provided a method of manufacturing a display apparatus, the method including: forming, on a glass substrate, a display module including a flexible substrate, a display panel, and an encapsulation film; forming an elasticity-adjusting layer on the display module; forming an upper module on the elasticity-adjusting layer; removing the glass substrate from the display module; and forming a lower module below the display module and coupled thereto. The elasticity-adjusting layer has an elastic modulus that is less than that of at least one of the display module, the upper module, and the lower module, so as to position a neutral plane in bending of the display apparatus to be within or proximate to the display module.

The elasticity-adjusting layer may be formed by simultaneously depositing at least two types of materials having different elastic moduli.

The elastic modulus of the elasticity-adjusting layer may be determined according to a ratio of at least two types of materials having different elastic moduli.

The upper module may have a thickness that is greater than that of the lower module.

The display panel may include a plurality of organic light-emitting devices (OLEDs) and a plurality of thin film transistors.

The encapsulation film may include at least one organic film and at least one inorganic film.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
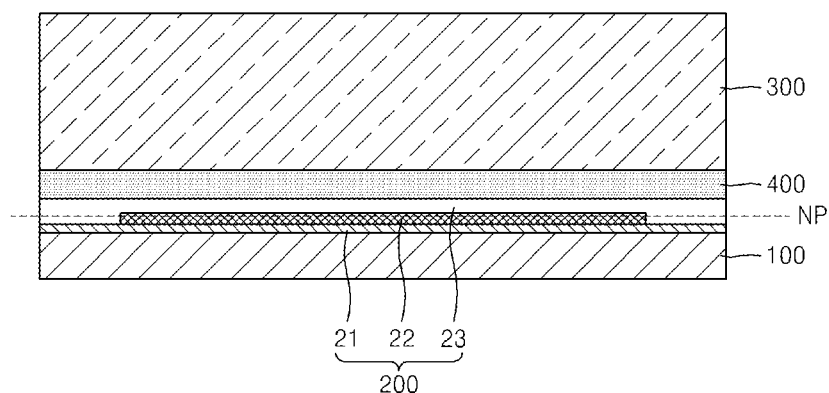
FIG. 1 is a schematic cross-sectional view illustrating a structure of a display apparatus according to an embodiment of the present invention.

The embodiments of the present disclosure will now be described in detail with reference to the accompanying drawings. Like reference numerals in the drawings denote like elements, and thus their repetitive description will be omitted. In addition, the sizes of components may be exaggerated for convenience and clarity of description.

The embodiments described below are only illustrative, and a variety of modifications may be derived from the embodiments. For example, when it is described that a certain layer is "on" or "above" a substrate or another layer, the certain layer may be directly above the substrate or another layer, or a third layer may be interposed therebetween.

The terminology used in the specification is used only to describe embodiments and does not have any intention to limit the present invention. In the specification, an expression in the singular includes an expression in the plural unless they are clearly different from each other in context. "Include" and/or "have" in the specification do not exclude the existence or addition of mentioned elements, steps, operations, and/or devices. Although terms such as "first" and "second" can be used to describe various elements, the elements cannot be limited by the terms. The terms can be used to classify a certain element from another element.

When a certain embodiment can be implemented differently, a specific process order may be performed different from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

All numerical values are approximate and may vary, as will be understood by one of ordinary skill in the art.

FIG. 1 is a schematic cross-sectional view illustrating a structure of a display apparatus 10 according to an embodiment of the present invention.

Referring to FIG. 1, the display apparatus 10 includes a display module 200, a lower module 100, an upper module 300, and an elasticity-adjusting layer 400.

The display module 200 includes a flexible substrate 21, a display panel 22, and an encapsulation film 23. The display module 200 may further include a polarizing plate (not shown). An elastic modulus of the display module 200 may be on the order of hundreds of GPa.

The flexible substrate 21 may be made of various materials, such as plastic materials, metal materials, and the like, which are bendable or flexible. In some embodiments, the flexible substrate 21 may be a fiber reinforced plastic (FRP). In some embodiments, the flexible substrate 21 may include fiber tissue and/or a polymer resin. The fiber tissue may be formed of optical fiber, or spun yarn or textile using optical fiber. The polymer resin may include epoxy resin, acrylic resin, and the like.

The display panel 22 is a panel for displaying characters, figures, or images and may include a plurality of display devices. Each of the plurality of display devices may be a liquid crystal display device, an organic light-emitting display device, a plasma display device, an electrophoretic display device, or the like. Each of the plurality of display devices may include one or more thin film transistors.

In some embodiments, each of the plurality of display devices may include signal lines including a gate line for transmitting a gate signal, a data line for transmitting a data signal, a switching device connected to the gate line and the data line, a pixel electrode which is connected to the switching device and which receives the data signal therethrough, and the like. Each of the plurality of display devices may form a unit pixel.

The encapsulation film 23 is to prevent the infiltration of air carrying humidity, oxygen, and the like, and may be formed to surround the upper surface and/or the side surfaces of the display panel 22. In some embodiments, the encapsulation film 23 may be formed as a multi-layer structure. For example, the encapsulation film 23 may be formed of a plurality of inorganic films or of the combination of a plurality of inorganic films and a plurality of organic films. In another embodiment, the encapsulation film 23 may have a film structure including low-melting glass, such as a material including a tin oxide (SnO).

The display module 200 may further include the polarizing plate on the encapsulation film 23. The polarizing plate may reduce the reflection of outside light, as well as improve contrast.

The upper module 300 and the lower module 100 may be components for protecting the display module 200. Since the thickness of the display module 200 is merely several or tens of μm, the display module 200 is easily bent or folded unintentionally. Thus, when the display module 200 is used without the upper module 300 and the lower module 100, the portability of the display apparatus 10 may worsen, and the display module 200 may be easily damaged. Accordingly, the upper module 300 and the lower module 100 are attached to the display module 200 to thereby improve the mechanical strength of the display module 200 and prevent damage to the display module 200. In some embodiments, the upper module 300 and/or the lower module 100 may formed as a plurality of layers. An elastic modulus of each of the upper module 300 and the lower module 100 may be on the order of tens of GPa.

The upper module 300 may further include components having other functions besides that of protecting the display module 200. For example, the upper module 300 may include a polarizing plate (not shown) for preventing reflection of outside light, a touch panel (not shown) having a touch sensor, a window disposed as the outermost layer, and an adhesive layer (not shown) which may be interposed between the components. Accordingly, the thickness of the upper module 300 may be different from that of the lower module 100. For example, the thickness of the upper module 300 may be several times thicker than the lower module 100. In some embodiments, the thickness of the upper module 300 may be from about 400 μm to about 600 μm, and the thickness of the lower module 100 may be from about 100 μm to about 200 μm.

In the current embodiment, the elasticity-adjusting layer 400 may be provided to minimize strain in a region of the display module 200. In more detail, the elasticity-adjusting layer 400 may minimize the strain in the region of the display module 200 by adjusting a position of a neutral plane NP formed in the display apparatus 10. The elasticity-adjusting layer 400 may also have an elastic modulus that is less than that of the display module 200, to thereby absorb shock which may be applied to the region of the display module 200.

As is known, the neutral plane NP is formed inside an object and indicates a plane which is bent but maintains its original length without extending or being diminished when bending is applied to the object. That is, the neutral plane NP indicates a plane where tension or compression does not actually occur, i.e. a plane of zero strain.

When strain is repeatedly applied to the display module 200, or when a strain force exceeding a breaking strength is applied to the display module 200, a display device such as a thin film transistor, a wiring, the encapsulation film 23, and/or the like, which are formed inside the display module 200 may be damaged. To prevent this problem, the neutral plane NP may be formed in the region of the display module 200 or a region adjacent thereto to thereby minimize strain applied to the display module 200.

The role of the elasticity-adjusting layer 400 will now be described in more detail with reference to FIGS. 2 and 3.

Figure 2:
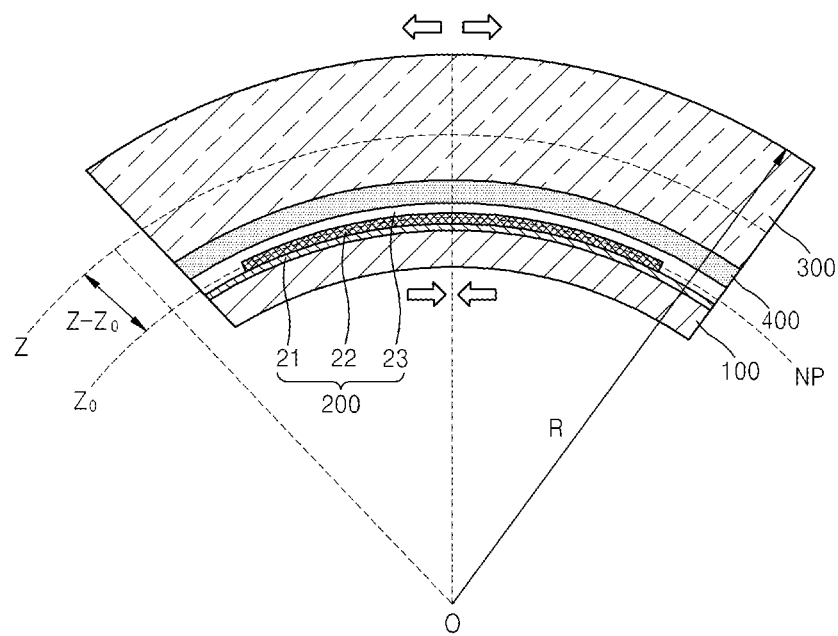
FIG. 2 is a cross-sectional view illustrating a state in which the display apparatus is bent and stressed.

FIG. 2 is a cross-sectional view illustrating a state where the display apparatus 10 is bent and stressed.

Referring to FIG. 2, since the display apparatus 10 is flexible, the display apparatus 10 may be bent with a radius of curvature R. In this case, strain ε according to tensile stress T and compressive stress C is applied to the display apparatus 10. The neutral plane NP may be formed in a region inside the display apparatus 10. When it is assumed that a coordinate of the neutral plane NP is $Z_0$, the strain ε according to a distance $(Z-Z_0)$ from the neutral plane NP may be expressed using the equation below:

$$\varepsilon = \frac{(z - z_0)}{R}$$

where R denotes an outer circumferential radius of curvature of the display apparatus 10. That is, strain applied to the display apparatus 10 increases with increasing distance of the position Z from the neutral plane NP and as the radius of curvature R decreases. The above equation indicates that the distance from the neutral plane NP increases as the thickness of the display apparatus 10 increases, and accordingly, a strain degree of the display apparatus 10 increases. Thus, as the thickness of the display apparatus 10 is thinner, strain according to the radius of curvature R decreases. A position of the neutral plane NP may vary according to an elastic modulus of materials forming the display apparatus 10.

Figure 3A:
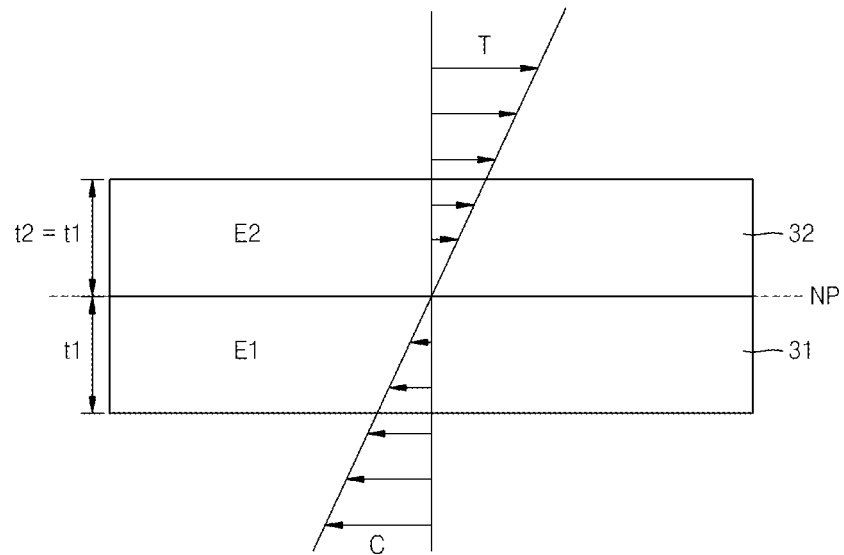
FIGS. 3A and 3B illustrate a position in which a neutral plane NP is formed according to a bending stress applied to an object.
Figure 3B:
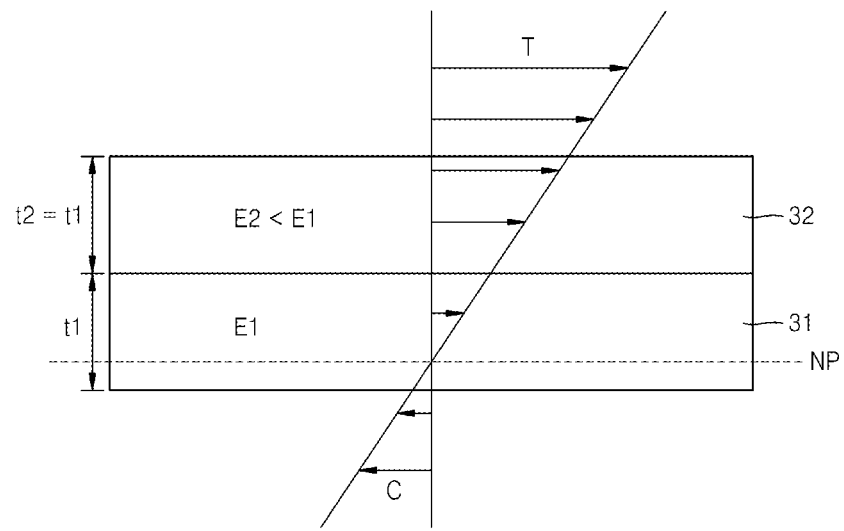

FIGS. 3A and 3B illustrate a position where the neutral plane NP is formed when stress is applied to an object.

Referring to FIG. 3A, the object may be conceptually divided into a first layer 31 and a second layer 32. It is assumed that an elastic modulus of the first layer 31 is E1 and an elastic modulus of the second layer 32 is E2. FIG. 3A shows a case where E1 is equal to E2. In this case, since degrees of strain of the first layer 31 and the second layer 32 according to a strain force are the same, the neutral plane NP is formed in the middle in the thickness direction of the object.

FIG. 3B shows a case where a relationship of mean elastic moduli of the first layer 31 and the second layer 32 is E2>E1. In this case, since a degree of strain of the second layer 32 is greater than that of the first layer 31, the neutral plane NP is formed in the first layer 31 that is below the middle in the thickness direction of the object. As described above, a position where the neutral plane NP is formed may vary according to the values of the two elastic moduli.

Thus, a position of the neutral plane NP formed inside the display apparatus 10 may be adjusted by adjusting the elastic modulus of the elasticity-adjusting layer 400.

Referring back to FIG. 1, the upper module 300 of the display apparatus 10 may be thicker than the lower module 100, and since most components included in the upper module 300 have a fixed or predetermined elastic modulus and a fixed thickness, it is difficult to voluntarily change the elastic modulus and thickness of the upper module 300.

There may be a method of placing the neutral plane NP in the region of the display module 200 by increasing the thickness of the lower module 100 as well as the thickness of the upper module 300. However, when the thickness of the lower module 100 increases, the overall thickness of the display apparatus 10 increases, thereby resulting in an increase in strain due to bending. This may cause damage to the display apparatus 10.

In the current embodiment, the elasticity-adjusting layer 400 is introduced to place the neutral plane NP in the region of the display module 200 or to be adjacent to or near the region of the display module 200, without changing the elastic moduli and/or the thicknesses of the upper module 300 and the lower module 100.

The elasticity-adjusting layer 400 may also help to absorb shock. The elasticity-adjusting layer 400 may be disposed on the display module 200. However, the current embodiment is not limited thereto, and the elasticity-adjusting layer 400 may instead be disposed below the display module 200. The elasticity-adjusting layer 400 may be disposed adjacent or near to the display module 200 and absorb shock which may be applied to the display module 200.

In general, the display module 200 may include a plurality of types of inorganic films. For example, inorganic films may be used as a buffer layer in the display panel 22 or the encapsulation film 23. An elastic modulus of the inorganic films is on the order of tens to hundreds of GPa, and accordingly, the elastic modulus of the display module 200 may be on the order of tens to hundreds of GPa. Thus, the display module 200 may be somewhat weak against shock or strain. It is thus desirable that shock which may be applied to the display module 200 be absorbed.

The elasticity-adjusting layer 400 may have an elastic modulus that is much less than elastic moduli of the display module 200, the upper module 300, and the lower module 100. Accordingly, the elasticity-adjusting layer 400 may absorb shock which may be applied to the display module 200. That is, the elasticity-adjusting layer 400 may buffer strain and thus prevent stress on the display apparatus 10 from influencing the display module 200.

In some embodiments, the elastic modulus of the elasticity-adjusting layer 400 may be about $10^6$ times less than that of the display module 200. In some embodiments, the elastic modulus of the elasticity-adjusting layer 400 may have a value in a range of about $1 \times 10^{-7}$ to about $0.6 \times 10^{-6}$ times that of the display module 200. In some embodiments, the elastic modulus of the elasticity-adjusting layer 400 may have a value in a range of about 10 kPa to about 150 kPa.

The elasticity-adjusting layer 400 may include at least two types of materials having different elastic moduli. Accordingly, the elastic modulus of the elasticity-adjusting layer 400 may be adjusted according to a ratio of elastic moduli of the materials included therein. For example, the elasticity-adjusting layer 400 having an elastic modulus of about 75 kPa can be achieved by one-to-one mixing a material having an elastic modulus of about 50 kPa and a material having an elastic modulus of about 100 kPa. In some embodiments, the elasticity-adjusting layer 400 may be formed of a plurality of layers having different elastic moduli. For example, the elasticity-adjusting layer 400 may be formed by alternately stacking a material having an elastic modulus of about 50 kPa and a material having an elastic modulus of about 100 kPa.

The elasticity-adjusting layer 400 may include a silicone-group resin or an acrylic-group resin. For example, the elasticity-adjusting layer 400 may include urethane acrylate. The elasticity-adjusting layer 400 may be transparent to visible rays. The elasticity-adjusting layer 400 may include a material having adhesiveness sufficient for the elasticity-adjusting layer 400 to function as an adhesive layer.

The thickness of the elasticity-adjusting layer 400 may be on the order of one to several times that of the display module 200. In some embodiments, the thickness of the elasticity-adjusting layer 400 may have a range of one to three times that of the display module 200. However, the thickness of the elasticity-adjusting layer 400 is not limited thereto, and various modifications may be made thereto so that the neutral plane NP is located in or adjacent to the region of the display module 200.

As described above, by introducing the elasticity-adjusting layer 400, the thickness of the display apparatus 10 may be minimized, and the neutral plane NP may be adjusted so that it is located in or adjacent to the region of the display module 200. In other words, by determining or fixing an elastic modulus and thickness of each of the individual components included in the upper module 300 or the lower module 100, and adjusting the elastic modulus and thickness of the elasticity-adjusting layer 400, the neutral plane NP may be located in or adjacent to the region of the display module 200.

FIGS. 4 to 7 are schematic cross-sectional views illustrating structures of display apparatuses 11, 12, 13, and 14 according to other embodiments of the present invention. In FIGS. 4 to 7, like reference numerals in FIG. 1 denote like elements, and thus their repetitive description will be omitted for simplification of description.

Figure 4:
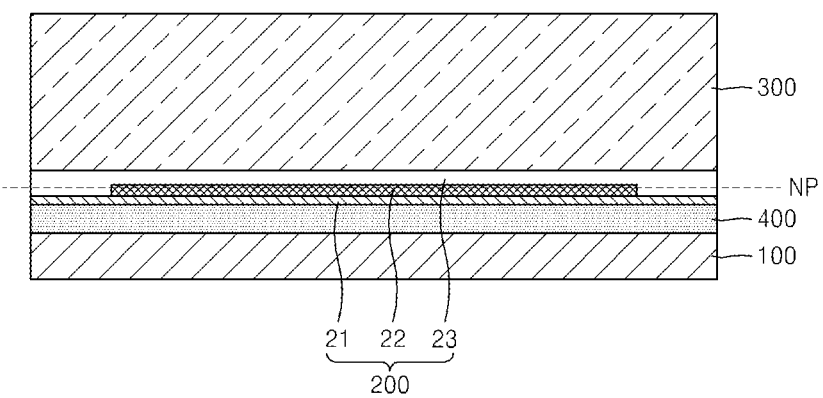
FIGS. 4 to 7 are schematic cross-sectional views illustrating structures of display apparatuses according to other embodiments of the present invention.

Referring to FIG. 4, the display apparatus 11 of FIG. 4 differs from the display apparatus 10 of FIG. 1 in that the elasticity-adjusting layer 400 is disposed below the display module 200, instead of above. That is, the elasticity-adjusting layer 400 may be disposed between the lower module 100 and the display module 200, and accordingly, the neutral plane NP may be adjusted to be located in or adjacent to the region of the display module 200.

Figure 5:
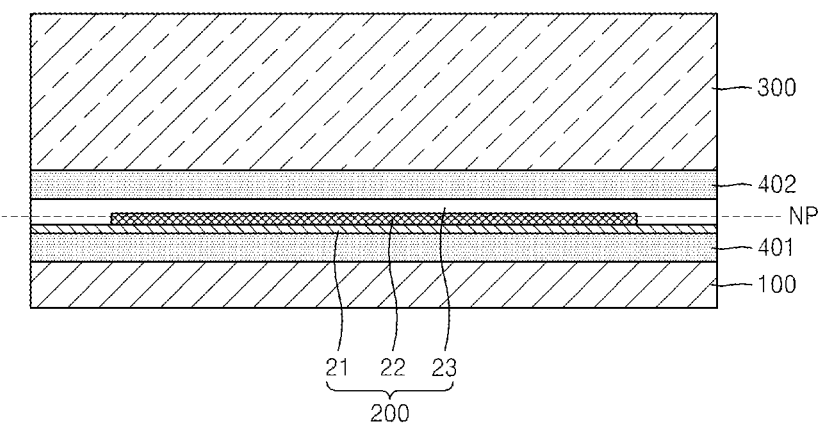

Referring to FIG. 5, the display apparatus 12 of FIG. 5 differs from the display apparatus 10 of FIG. 1 in that first and second elasticity-adjusting layers 401 and 402 are respectively disposed below and on the display module 200. That is, the first elasticity-adjusting layer 401 may be disposed between the lower module 100 and the display module 200, and the second elasticity-adjusting layer 402 may be disposed between the display module 200 and the upper module 300.

The first and second elasticity-adjusting layers 401 and 402 may have substantially the same physical properties as those of the elasticity-adjusting layer 400 described with reference to FIG. 1. That is, an elastic modulus of each of the first and second elasticity-adjusting layers 401 and 402 is less than that of each of the display module 200, the upper module 300, and the lower module 100.

The elastic moduli and thicknesses of the first and second elasticity-adjusting layers 401 and 402 may vary. Accordingly, the neutral plane NP may be adjusted to be located in or adjacent to the region of the display module 200.

By respectively disposing the first and second elasticity-adjusting layers 401 and 402 below and on the display module 200, the absorption of shock which may be applied to the display module 200 may be improved.

Figure 6:
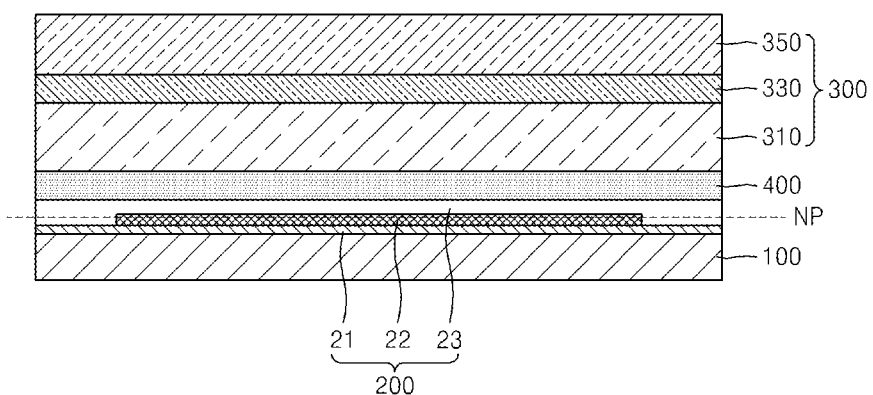

Referring to FIG. 6, the upper module 300 of the display apparatus 13 includes a touch panel 310, an adhesive layer 330, and a window 350. The upper module 300 may further include various well-known function layers, such as a protective film and the like.

The touch panel 310 senses a touch. The touch panel 310 may be formed of a plurality of layers, such as a touch sheet including a touch sensor in which a plurality of electrodes are included, a reflection prevention sheet, a noise blocking sheet, and/or the like. The touch sensor may sense a change in a capacitance or other properties that can indicate a touch.

The adhesive layer 330 may function to combine the components of the upper module 300, i.e. to couple them together. The adhesive layer 330 may attach the touch panel 310 and the window 350 to each other. The adhesive layer 330 may include an optical clear adhesive (OCA).

The window 350 may function to increase a mechanical strength, and protect the components, of the display apparatus 13. The window 350 may be formed of a material, such as polyethylene terephthalate (PET), polycarbonate (PC), polyether sulfone (PES), polyimide (PI), polymethyl methacrylate (PMMA), or the like, which allows light to pass therethrough and which is flexible.

In some embodiments, the window 350 may further include a touch sensing function. In this case, the touch panel 310 may be omitted.

Figure 7:
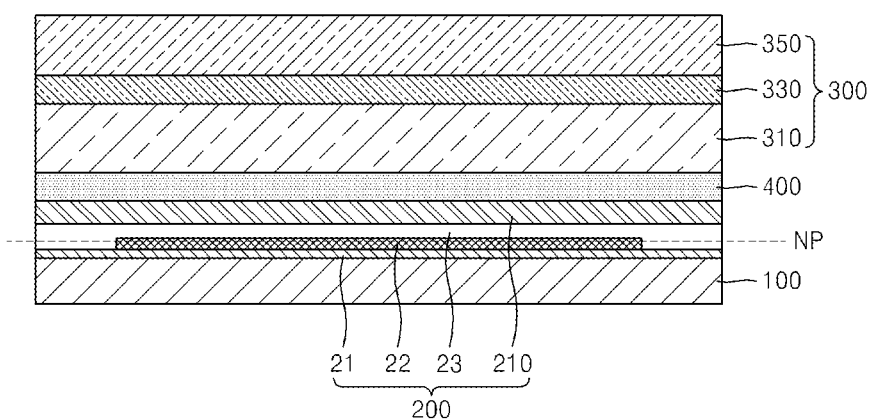

Referring to FIG. 7, the display apparatus 14 differs from the display apparatus 13 of FIG. 6 in that the display module 200 further includes a polarizing plate 210.

The polarizing plate 210 may prevent the reflection of outside light. The polarizing plate 210 may be formed from a plurality of layers including a polarizing layer (not shown), a support layer (not shown) for supporting the polarizing layer, and the like.

The polarizing layer functions to polarize light incident from a light source to light in the same direction as a polarizing axis. In some embodiments, the polarizing layer may be formed of a polyvinyl alcohol (PVA) film including a polarizer and/or a dichroic dye. The dichroic dye may include iodine molecules and/or dye molecules.

The support layer may support the polarizing layer and function to supplement a mechanical strength of the polarizing layer.

Figure 8:
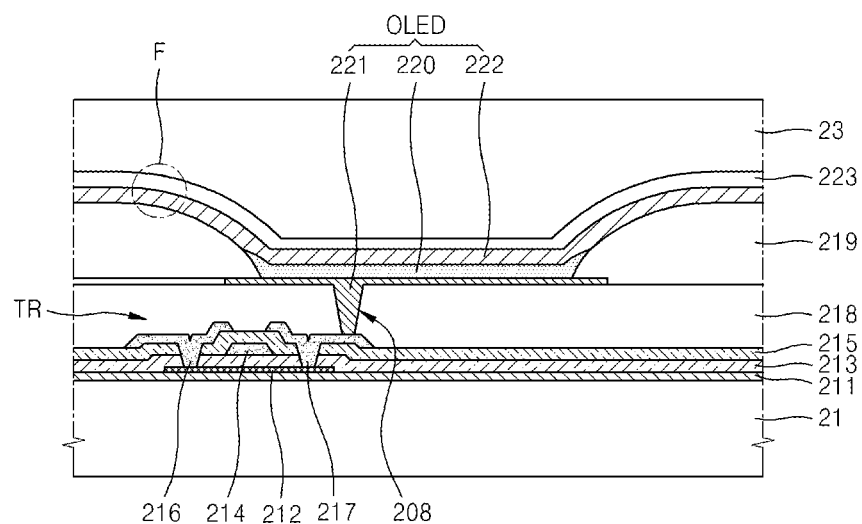
FIG. 8 is a schematic cross-sectional view of a display device which may be included in embodiments of the present invention.
Figure 9:
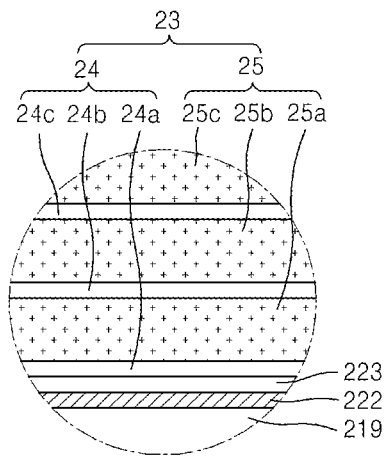
FIG. 9 is a magnified view of region F of FIG. 8.

FIG. 8 is a schematic cross-sectional view of a display device which may be included in embodiments of the present invention, and FIG. 9 is a magnified view of region F of FIG. 8.

The display apparatuses 10, 11, 12, 13, and 14, or others constructed in accordance with other embodiments, may include an organic light-emitting device OLED and a thin film transistor TR as a display device. Accordingly, the display panel 22 may include a plurality of organic light-emitting devices OLEDs and a plurality of thin film transistors TRs that are separated or spaced apart from each other. The plurality of organic light-emitting devices OLEDs and the plurality of thin film transistors TRs may be formed on the flexible substrate 21. The flexible substrate 21 may be formed of a glass material, a plastic material, or a metallic material.

A buffer layer 211 may be formed on the flexible substrate 21. The buffer layer 211 may include an insulation material to provide a substantially flat plane on the flexible substrate 21 and to prevent the infiltration of humidity and foreign substances into the flexible substrate 21.

On the buffer layer 211, a thin film transistor TR, a capacitor (not shown), and an organic light-emitting device OLED may be formed. The thin film transistor TR may mainly include an active layer 212, a gate electrode 214, and source and drain electrodes 216 and 217. The organic light-emitting device OLED may include a first electrode 221, a second electrode 222, and an intermediate layer 220.

In detail, the active layer 212 formed in a predetermined pattern may be disposed on the buffer layer 211. The active layer 212 may include an inorganic semiconductor material such as silicon, an organic semiconductor material, or an oxide semiconductor material, and may be formed by injecting a p- or n-type dopant thereinto.

A gate insulation film 213 may be formed on the active layer 212. The gate electrode 214 may be formed on the gate insulation film 213 to correspond to the active layer 212.

An inter-layer insulation film 215 may be formed to cover the gate electrode 214, and the source and drain electrodes 216 and 217 may be formed on the inter-layer insulation film 215. In this case, the source and drain electrodes 216 and 217 may be formed to contact a particular region of the active layer 212.

A planarization film 218 may be formed to cover the source and drain electrodes 216 and 217, and an additional insulation film may be further formed on the planarization film 218.

The first electrode 221 may be formed on the planarization film 218. The first electrode 221 may be formed to electrically connect to any one of the source and drain electrodes 216 and 217 via a through hole 208.

A pixel definition film 219 may be formed to partially cover the first electrode 221. After forming a predetermined aperture in the pixel definition film 219, the intermediate layer 220, including an organic emission layer, may be formed within a region limited by the predetermined aperture. The pixel definition film 219 can define a pixel region and a non-pixel region. That is, the predetermined aperture of the pixel definition film 219 can be substantially the pixel region.

The intermediate layer 220 may further include a hole injection layer (HIL), a hole transport layer (HTL), an electron transport layer (ETL), and an electron injection layer (EIL) in addition to the organic emission layer.

The second electrode 222 may be formed on the intermediate layer 220. The first electrode 221 may be patterned for each pixel, and the second electrode 222 may be formed so that a common voltage can be applied to all pixels.

Although only one organic light-emitting device OLED is shown in FIG. 8, the display apparatus 10 may include a plurality of organic light-emitting devices OLEDs. One pixel may be formed for each organic light-emitting device OLED, and red, green, blue, or white colors, or others as desired, may be realized for each pixel.

However, the present disclosure is not limited thereto. The intermediate layer 220 may be commonly formed over the entire, or substantially the entire, planarization film 218 regardless of a position of each pixel. In this case, the organic emission layer may be formed by, for example, vertically stacking or combining layers including light-emitting materials that emit red, green, and blue light. Of course, if white light is to be emitted, a combination of other colors is also possible. A color conversion layer or a color filter for converting the emitted white light to a predetermined color may be further included.

A protective layer 223 may be disposed on the organic light-emitting device OLED and the pixel definition film 219, and may function to cover and protect the organic light-emitting device OLED. The protective layer 223 may be formed using an inorganic insulation film and/or an organic insulation film.

The encapsulation film 23 may include an inorganic film 24 and an organic film 25, wherein the inorganic film 24 may include a plurality of inorganic films 24a, 24b, and 24c, and the organic film 25 may include a plurality of organic films 25a, 25b, and 25c. Although FIG. 9 shows a structure in which the inorganic film 24 and the organic film 25 are alternately laminated, the present disclosure is not limited thereto, and any order of any of these films is contemplated.

FIGS. 10A to 10D are cross-sectional views sequentially illustrating a method of manufacturing the display apparatuses 10, 11, 12, 13, and 14 according to embodiments of the present invention. In the current embodiment, a method of manufacturing the display apparatus 10 of FIG. 1 is described as an example.

Figure 10A:
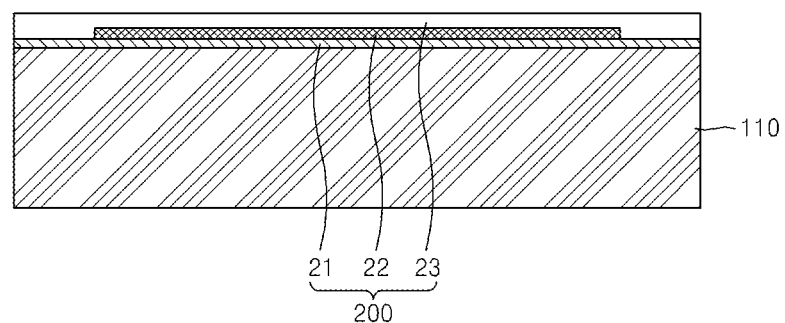
FIGS. 10A to 10D are cross-sectional views sequentially illustrating a method of manufacturing a display apparatus according to an embodiment of the present invention.

Referring to FIG. 10A, the flexible substrate 21 is formed on a glass substrate 110. The flexible substrate 21 may be formed of a plastic material having good heat resistance and durability, such as polyethylene terephthalate (PET), polyethylene naphthalate (PEN), polycarbonate (PC), polyarylate (PAR), polyetherimide (PEI), polyether sulfone (PES), polyimide (PI), or the like.

A flexible substrate 21 formed of a plastic material has the property of bending or extending when heat is applied thereto, and thus it is difficult to precisely form a thin film pattern, such as various types of electrodes or conductive wirings, on the flexible substrate 21. Accordingly, various thin film pattern forming processes may be subsequently performed when the flexible substrate 21 is attached to the glass substrate 110.

Thereafter, the buffer layer 211 is formed on the flexible substrate 21, and a thin film transistor TR and an organic light-emitting device OLED are formed on the buffer layer 211. Thereafter, the display module 200 is completed by forming the encapsulation film 23 on the flexible substrate 21 to cover the organic light-emitting device OLED and the thin film transistor TR.

Figure 10B:
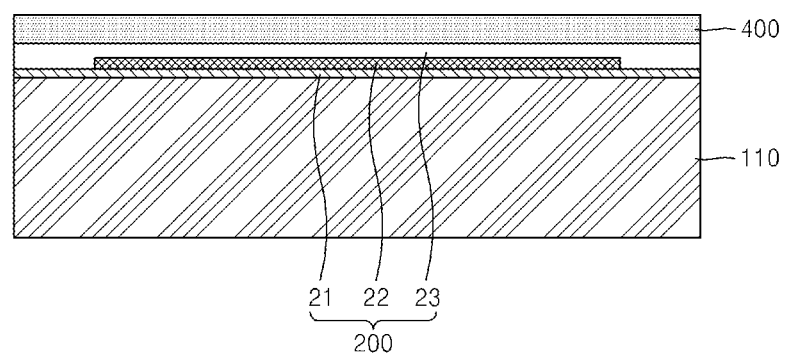

Referring to FIG. 10B, the elasticity-adjusting layer 400 is then formed on the display module 200. The elasticity-adjusting layer 400 is formed to have a predetermined elastic modulus and thickness according to the elastic moduli and thicknesses of the lower module 100, the display module 200, and the upper module 300.

To adjust the elastic modulus of the elasticity-adjusting layer 400, materials having different elastic moduli may be combined at a predetermined ratio. Alternatively, the elasticity-adjusting layer 400 may be formed of a plurality of layers having different elastic moduli.

The elasticity-adjusting layer 400 may be coated or deposited by inkjet printing, slot die coating, flash evaporation, or the like. In some embodiments, the elasticity-adjusting layer 400 may be hardened by heat and/or light. In some embodiments, the elasticity-adjusting layer 400 may be formed by simultaneously depositing materials having different elastic moduli.

Figure 10C:
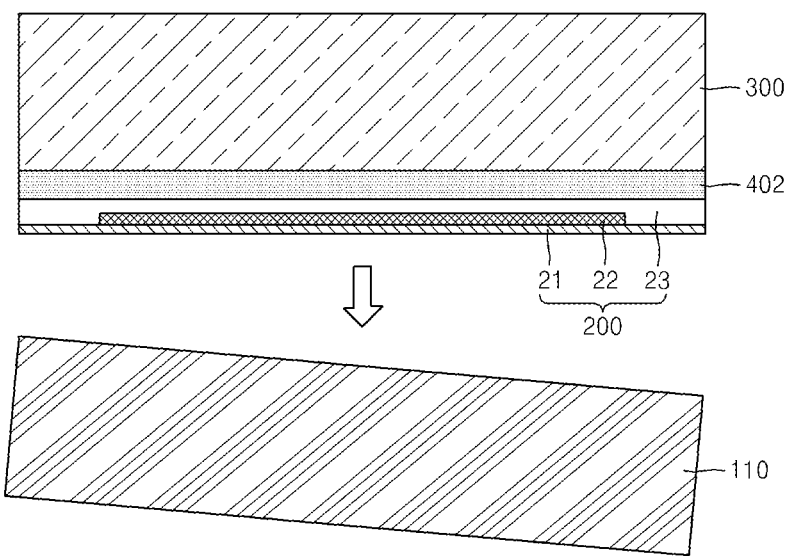

Referring to FIG. 10C, the upper module 300 is formed on the elasticity-adjusting layer 400, and then the glass substrate 110 is separated from the flexible substrate 21.

Figure 10D:
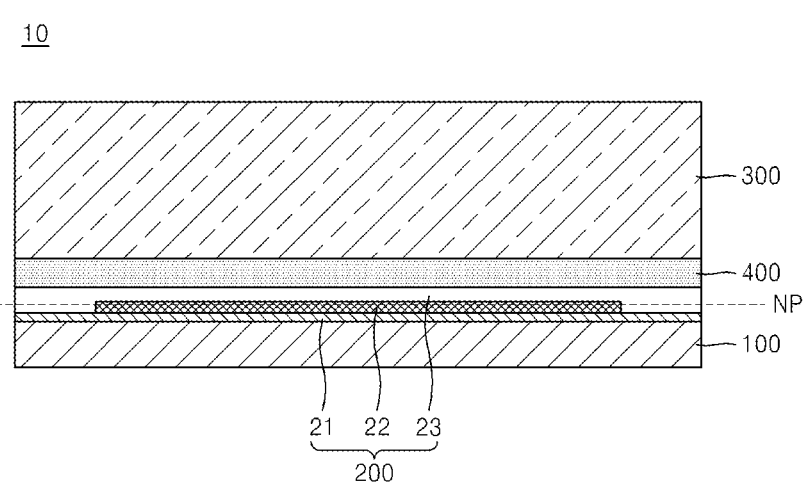

Referring to FIG. 10D, the lower module 100 is formed below the flexible substrate 21 to be affixed thereto.

According to the above described manufacturing method, the display apparatuses 10, 11, 12, 13, and 14 may have improved durability and increased reliability against strain such as bending.

Hereinafter, an experiment carried out according to an embodiment of the present invention is described. Table 1 illustrates thicknesses and elastic moduli of the lower module 100, the display module 200, and the upper module 300, and Table 2 illustrates results of a bending test while reducing the elastic modulus of the elasticity-adjusting layer 400. In this case, the thickness of the elasticity-adjusting layer 400 is about 50 μm.

TABLE 1

|  | Thickness | Elastic modulus |
|---|---|---|
| Upper module | About 600 μm | About 50 GPa |
| Display module | About 20 μm | About 250 GPa |
| Lower module | About 100 μm | About 25 GPa |

TABLE 2

| Elastic modulus of elasticity-adjusting layer (kPa) | Bending test result |
|---|---|
| 250 | Cracks in display module |
| 200 | Cracks in display module |
| 150 | OK |
| 100 | OK |
| 45 | OK |
| 24 | OK |
| 16 | OK |
| 11 | OK |

As described above, when a bending test is performed while varying the elastic modulus of the elasticity-adjusting layer 400 within a range of about 10 kPa to about 150 kPa, no cracks were found to occur in the display module 200. When the elastic modulus is equal to or greater than 200 kPa, cracks were found to occur in the display module 200.

A display apparatus as described above includes an elasticity-adjusting layer whose elastic modulus can be set to thereby minimize strain of a display module including a display device. In addition, the elastic modulus of the elasticity-adjusting layer is somewhat easy to adjust, thereby allowing for ready adjustment of the amount of strain undergone by the display module.

Accordingly, a display apparatus has improved durability against strain occurring during applied stresses or deformations, such as bending or the like, and thus has increased reliability.

While the display apparatuses 10, 11, 12, 13, and 14 and a corresponding display device have been described with reference to the accompanying drawings to help the understanding thereof, they are only illustrative, and it will be understood by one of ordinary skill in the art that various changes in form and details may be made therein without departing from the spirit and scope of the present invention as defined by the following claims. Embodiments of the invention may include any combination or permutation of any one or more of the features described above.

What is claimed is:

1. A display apparatus comprising:
   a display module comprising a flexible substrate, a display panel, and an encapsulation film;
   a lower module disposed below the display module;
   an upper module disposed on the display module; and
   an elasticity-adjusting layer disposed on or below the display module to adjust a position of a neutral plane in bending of the display apparatus,
   wherein an elastic modulus of the elasticity-adjusting layer is less than that of at least one of the display module, the lower module, and the upper module, so as to position the neutral plane within or proximate to the display module.

2. The display apparatus of claim 1, wherein the elasticity-adjusting layer comprises least two types of materials having different elastic moduli.

3. The display apparatus of claim 1, wherein the elasticity-adjusting layer comprises a stack of at least two types of materials having different elastic moduli.

4. The display apparatus of claim 1, wherein the elasticity-adjusting layer includes at least one of a silicone-group resin and an acryl-group resin.

5. The display apparatus of claim 1, wherein the elastic modulus of the elasticity-adjusting layer is about six orders of magnitude less than that of the display module.

6. The display apparatus of claim 1, wherein the elastic modulus of the elasticity-adjusting layer has a value within a range of about $1 \times 10^{-7}$ to about $0.6 \times 10^{-6}$ times that of the display module.

7. The display apparatus of claim 1, wherein the elasticity-adjusting layer includes an adhesive material.

8. The display apparatus of claim 1, wherein the thickness of the elasticity-adjusting layer has a value within a range of about one to about three times that of the display module.

9. The display apparatus of claim 1, wherein the upper module comprises a touch panel, an adhesive layer, and a window.

10. The display apparatus of claim 1, wherein the upper module has a thickness that is greater than that of the lower module.

11. A display apparatus comprising:
    a display module comprising a flexible substrate, a display device, an encapsulation film, and a polarizing plate;
    a lower module disposed below the display module;
    a first elasticity-adjusting layer disposed between the lower module and the display module;
    an upper module disposed on the display module; and
    a second elasticity-adjusting layer disposed between the upper module and the display module,
    wherein the first elasticity-adjusting layer and the second elasticity-adjusting layer each have an elastic modulus that is less than that of at least one of the display module, the lower module, and the upper module, so as to position a neutral plane in bending of the display apparatus to be within or proximate to the display module.

12. The display apparatus of claim 11, wherein the upper module comprises a touch panel, an adhesive layer, and a window.

13. The display apparatus of claim 11, wherein the upper module has a thickness that is greater than that of the lower module.

14. The display apparatus of claim 11, wherein the display module comprises an organic light-emitting device and a thin film transistor.

15. A method of manufacturing a display apparatus, the method comprising:
    forming, on a glass substrate, a display module comprising a flexible substrate, a display panel, and an encapsulation film;

forming an elasticity-adjusting layer on the display module;

forming an upper module on the elasticity-adjusting layer;

removing the glass substrate from the display module; and forming a lower module below the display module and coupled thereto, wherein the elasticity-adjusting layer has an elastic modulus that is less than that of at least one of the display module, the upper module, and the lower module, so as to position a neutral plane in bending of the display apparatus to be within or proximate to the display module.

16. The method of claim 15, wherein the forming an elasticity-adjusting layer further comprises simultaneously depositing at least two types of materials having different elastic moduli.

17. The method of claim 15, wherein the elastic modulus of the elasticity-adjusting layer is determined according to a ratio of at least two types of materials having different elastic moduli.

18. The method of claim 15, wherein the upper module has a thickness that is greater than that of the lower module.

19. The method of claim 15, wherein the display panel comprises a plurality of organic light-emitting devices and a plurality of thin film transistors.

20. The method of claim 15, wherein the encapsulation film comprises at least one organic film and at least one inorganic film.

* * * * *